United States Patent
Seetharaman et al.

(10) Patent No.: US 11,243,252 B1
(45) Date of Patent: Feb. 8, 2022

(54) PROCESSOR TO JTAG TEST DATA REGISTER INTERFACE

(71) Applicant: Cisco Technology, Inc., San Jose, CA (US)

(72) Inventors: Venkatasubramanian Seetharaman, Bangalore (IN); Chuanyun Fan, Fremont, CA (US); Fanchen Zhang, San Jose, CA (US); Jing Tu, San Jose, CA (US); Abby Huggins Lee, Fremont, CA (US); Thomas Karabinas, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/995,179

(22) Filed: Aug. 17, 2020

(51) Int. Cl.
*G01R 31/3177* (2006.01)
*G06F 9/448* (2018.01)
*G01R 31/3185* (2006.01)

(52) U.S. Cl.
CPC . *G01R 31/3177* (2013.01); *G01R 31/318555* (2013.01); *G01R 31/318594* (2013.01); *G06F 9/4498* (2018.02)

(58) Field of Classification Search
CPC ........ G01R 31/3177; G01R 31/318594; G01R 31/318555; G06F 9/4498
See application file for complete search history.

(56) References Cited

U.S. PATENT DOCUMENTS

| | | |
|---|---|---|
| 6,681,359 B1 | 1/2004 | Au et al. |
| 7,908,533 B2 | 3/2011 | Somasundaram et al. |
| 7,949,918 B2 | 5/2011 | Douskey et al. |
| 8,677,198 B2 | 3/2014 | Goyal et al. |
| 9,323,633 B2 | 4/2016 | Brambilla et al. |
| 10,024,913 B2 | 7/2018 | Whetsel |
| 10,184,983 B2 | 1/2019 | Mistry et al. |
| 2005/0210345 A1 | 9/2005 | Bybell |
| 2007/0118782 A1* | 5/2007 | Whetsel ............... G01R 31/28 714/729 |
| 2012/0324302 A1* | 12/2012 | Arslan .......... G01R 31/318572 714/727 |
| 2013/0328583 A1 | 12/2013 | Wada et al. |
| 2014/0298122 A1* | 10/2014 | Brambilla ............ G06F 11/267 714/724 |

OTHER PUBLICATIONS

"IEEE Standard for Test Access Port and Boundary-Scan Architecture," in IEEE Std 1149.1-2013 (Revision of IEEE Std 1149.1-2001) , vol., no., pp. 1-444, May 13, 2013 (Year: 2013).*

(Continued)

*Primary Examiner* — Cynthia Britt
(74) *Attorney, Agent, or Firm* — Edell, Shapiro & Finnan, LLC

(57) ABSTRACT

A method includes disconnecting a data bus connecting a test access port (TAP) controller of an integrated circuit (IC) chip to a plurality of test data registers deployed on the chip, simultaneously supplying test data to multiple test data registers among the plurality of test data registers, and storing test response data, received from the plurality of test data registers and responsive to the test data, in storage registers deployed on the chip.

20 Claims, 6 Drawing Sheets

(56) References Cited

OTHER PUBLICATIONS

"IEEE Standard for Access and Control of Instrumentation Embedded within a Semiconductor Device," in IEEE Std 1687-2014, vol., no., pp. 1-283, Dec. 5, 2014 (Year: 2014).*
ASSET InterTech, Inc., "IEEE P1687 Internal JTAG (IJTAG) Tutorial", Circuitnet, 2011, retrieved from Internet Apr. 23, 2020, 9 pages.
International Search Report and Written Opinion in counterpart International Application No. PCT/US2021/045644, dated Dec. 7, 2021, 13 pages.

* cited by examiner

PROCESSOR TO JTAG TEST DATA REGISTER INTERFACE

TECHNICAL FIELD

The present disclosure relates generally to an interface for accessing JTAG test data registers deployed on individual integrated circuit chips.

BACKGROUND

As the complexity of integrated circuits continues to increase, new approaches for testing such devices are constantly being developed. These approaches include the design and use of circuitry that is specifically configured for testing the integrated circuit in which it is implemented. One such approach is the use of an Institute for Electrical and Electronics Engineers (IEEE) 1149.1 Standard Joint Test Action Group (JTAG) Test Access Port (TAP) controller. Such a standardized TAP controller is implemented using a 16 state finite state machine (FSM) to execute various instructions related to testing for manufacturing defects of a circuit Another approach that has been implemented for test and diagnostics is the IEEE 1687-2014 Standard for Access and Control of Instrumentation Embedded within a Semiconductor Device, sometimes referred to as "IJTAG".

DESCRIPTION OF EXAMPLE EMBODIMENTS

Overview

Presented herein are methodologies for accessing JTAG test data registers. The methodology includes disconnecting a data bus connecting a test access port (TAP) controller of an integrated circuit (IC) chip to a plurality of test data registers deployed on the chip, simultaneously supplying test data to multiple test data registers among the plurality of test data registers, and storing test response data, received from the plurality of test data registers and responsive to the test data, in storage registers deployed on the chip A device or apparatus is also described. The device may include a test access port (TAP) controller deployed on an integrated circuit (IC) chip; a plurality of test data registers deployed on the chip and selectably in communication with the TAP controller via a data bus; and a processor, when executing the logic instructions, configured to: disconnect the data bus connecting the TAP controller to the plurality of test data registers deployed on the chip, simultaneously supply test data to multiple test data registers among the plurality of test data registers, and store test response data, received from the plurality of test data registers and responsive to the test data, in storage registers deployed on the chip.

Example Embodiments

In system level diagnostics, JTAG pins are not guaranteed directly accessible. To address that issue, an approach called "CPU2JTAG" was developed and is disclosed in detail in U.S. Pat. No. 7,908,533, which is incorporated herein by reference. CPU2JTAG enables direct access to a TAP controller by a central processing unit (CPU) by converting information, stored in a CPU register, into the JTAG protocol to perform design for testability (DFT) tests or diagnostics in system.

However, even with the benefits of CPU2JTAG, the JTAG protocol is still a time consuming testing approach because, among other things, there is still reliance on the 16 state FSM. In the silicon industry, test time directly impacts production capacity, throughput, and cost. In this regard, it is common to combine chips from different silicon vendors on a single system board. Under such a scenario, test-in-system takes on an ever more important role for product yield. At the same time, newer generation designs include increasingly more embedded memory modules, more Serializer/Deserializer (SerDes) channels, and many embedded functions (e.g., PLL, Thermal/Voltage Sensor, etc.), which can be tested through the JTAG interface provided by the chip supplier. However, this causes board/system testing to be extremely time-consuming as each test needs to follow the JTAG protocol through, e.g., the serial test data in (TDI)—test data out (TDO) interfaces consistent with the 16 state FSM.

Figure 1:
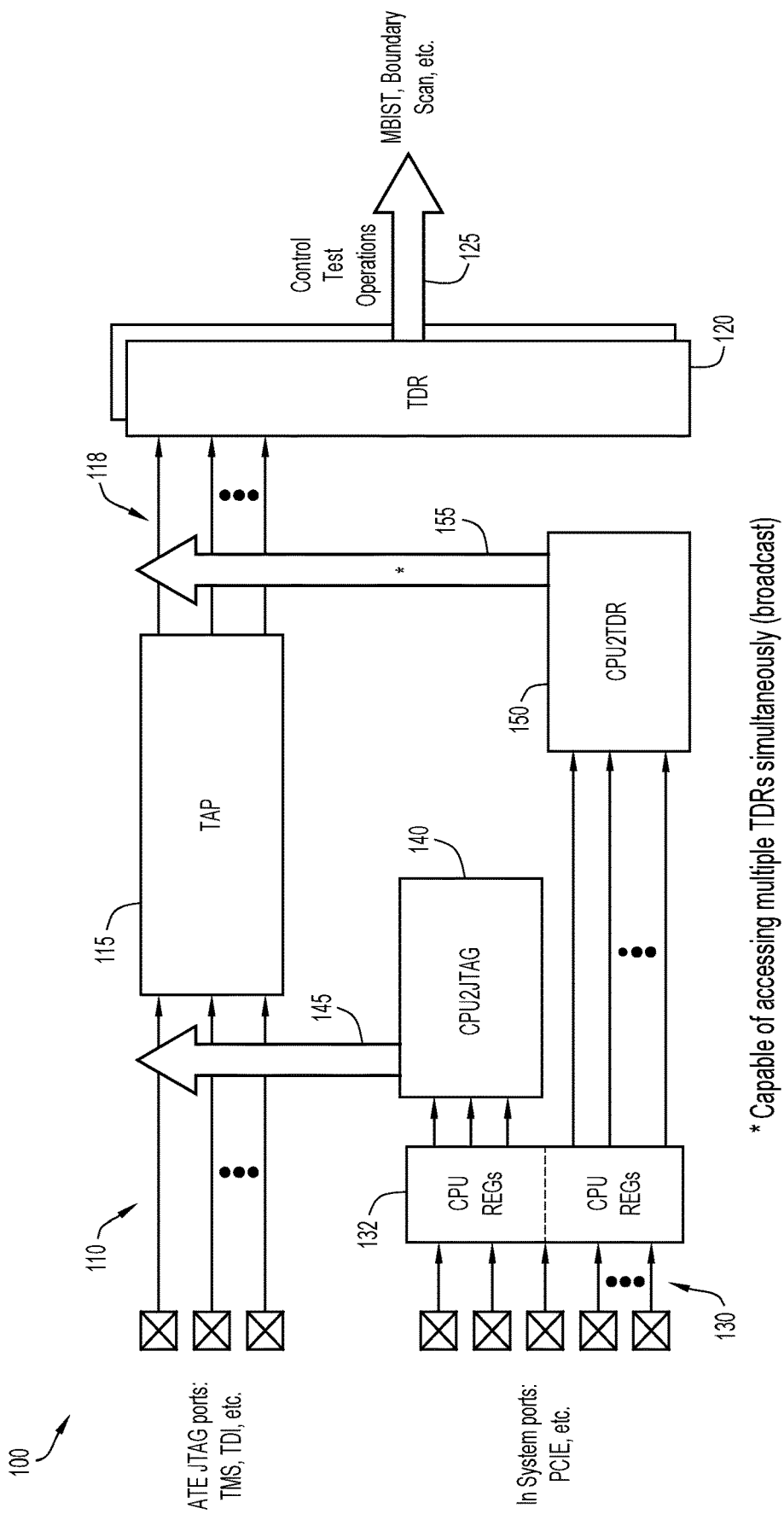
FIG. 1 shows a system including "CPU2TDR" interface logic, which enables a CPU to directly interact with test data registers on a chip and bypass a test access port (TAP) controller, and also including CPU2JTAG interface logic, in accordance with an example embodiment.

FIG. 1 shows a system 100 including CPU2TDR interface logic 150 that enables a CPU (not shown) to directly interact with test data registers 120, and to thereby bypass a test access port (TAP) controller 115, in accordance with an example embodiment. More specifically, FIG. 1 shows JTAG ports 110, which are compliant with, e.g., the JTAG standard wherein automatic test equipment (ATE) (not shown) supports signals such as TMS (test mode select), test data in (TDI), and test data out (TDO), for example. JTAG ports 110 are in communication with TAP controller 115, which is, in turn, in communication, via bus 118, to one or more TDRs 120. The TDRs 120 are configured to support control test operations including, e.g., memory built-in self-tests (MBISTs), etc., consistent with the JTAG standard, and observe test responses.

FIG. 1 also shows in-system ports 130 that are connected to a bus, such as a PCIe bus, or CPU standard bus, e.g., Advanced High Performance Bus (AHB), Advanced extensible bus (AXI), or any other proprietary bus to enable a CPU (not shown) to access CPU registers (REGs) 132. In one possible embodiment, CPU registers 132 are connected to CPU2JTAG logic 140 that enables a CPU to take over the JTAG ports 110 via appropriate multiplexers and bus 145.

This functionality is described in U.S. Pat. No. 7,908,533 and, for the sake of brevity, is not described further herein.

CPU registers 132 are also in communication with CPU2TDR interface logic 150. As will be described more fully herein, CPU2TDR interface logic 150, in concert with appropriate multiplexers, allows a CPU to access TDRs 120 directly via bus 155, and thus bypass TAP controller 115 entirely, resulting in much faster access to individual TDRs 120.

Figure 2:
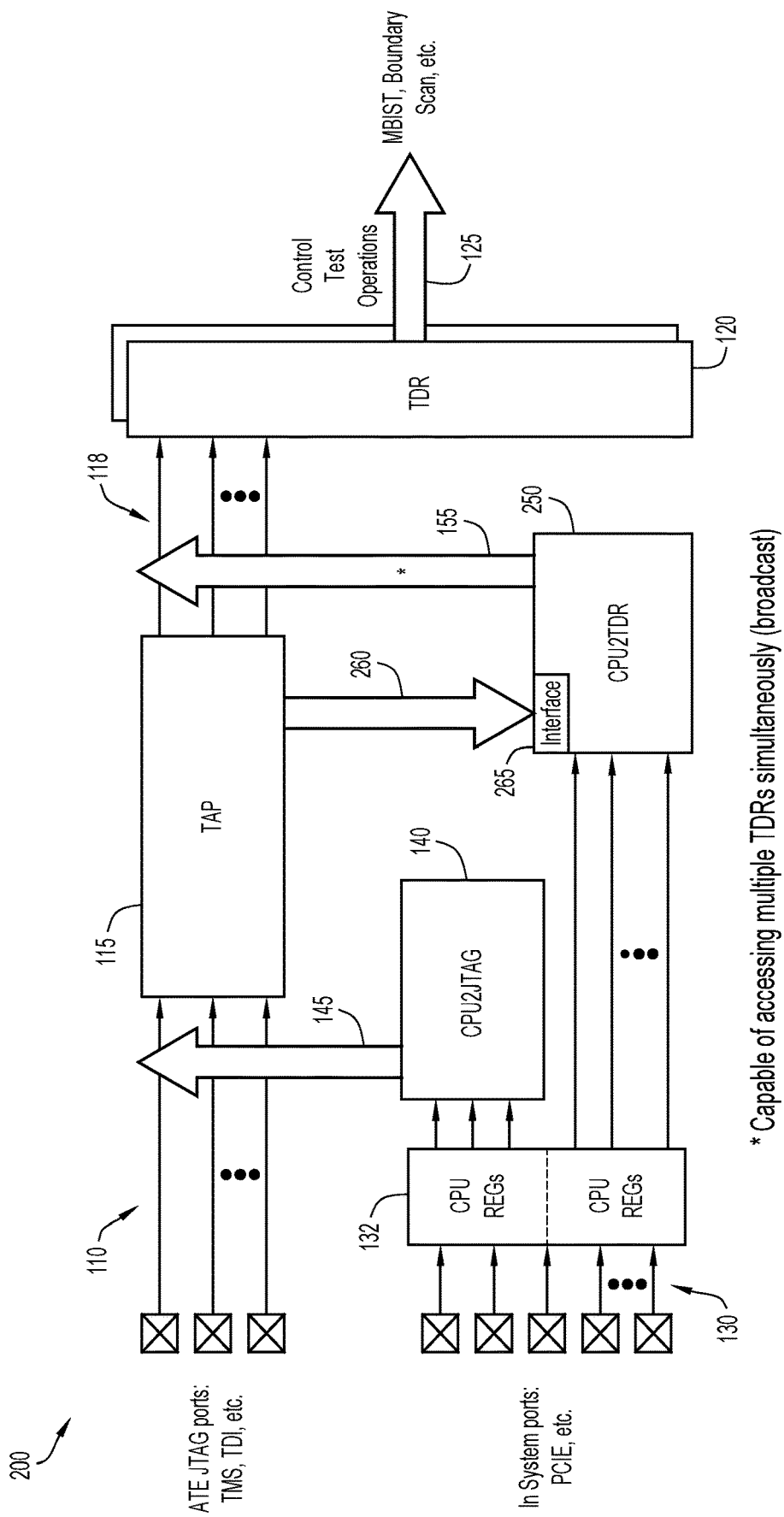
FIG. 2 shows a system including CPU2TDR interface logic, which enables a CPU to directly interact with test data registers on a chip and bypass the TAP controller, and further enables the TAP controller to leverage the CPU2TDR interface logic to support TDR broadcast functionality, in accordance with an example embodiment.

FIG. 2 shows a system including CPU2TDR interface logic 250 that enables a CPU to directly interact with TDRs 120, and bypass TAP controller 115, and further enables TAP controller 115 to leverage the CPU2TDR interface logic 250 to support TDR broadcast functionality, in accordance with an example embodiment. That is, the system 200 depicted in FIG. 2 is substantially similar to that shown in FIG. 1, except in the depicted embodiment of FIG. 2, CPU2TDR interface logic 250 provides an interface 265 to TAP controller 115 enabling, for example, signals received via bus 260, to be broadcast to multiple TDRs simultaneously. Such broadcast functionality is not supported via an IEEE 1149.1 standard compliant TAP controller, which can operate on/access only one TDR at a time. The remainder of the instant description is described in the context of CPU2TDR interface logic 250, noting that, except for interface 265, is substantially similar to CPU2TDR interface logic 150.

Figure 3:
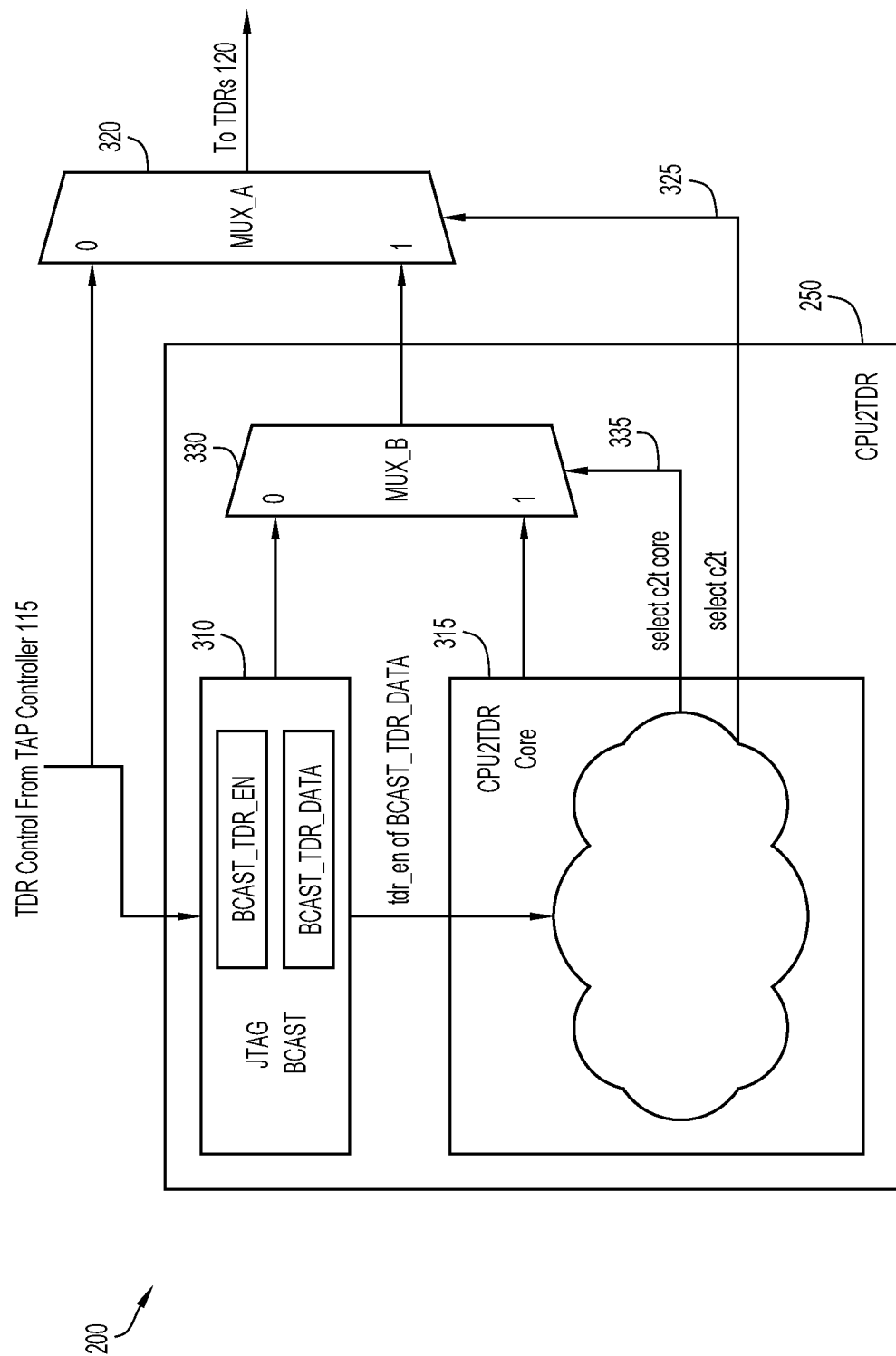
FIG. 3 shows details of a portion of the CPU2TDR interface logic, in accordance with an example embodiment.

FIG. 3 shows details of some of the CPU2TDR interface logic 250, in accordance with an example embodiment. As shown, CPU2TDR interface logic 250 includes a JTAG broadcast controller 310, a CPU2TDR core module 315, a first multiplexer (MUX_A) 320 and a second multiplexer (MUX_B) 330. MUX_A 320 is controlled by select_c2t 325, which selects whether communication to the TDRs 120 is directly from TAP controller 115, or whether communication to the TDRs 120 is from the CPU2TDR interface logic 250.

MUX_B 330 is controlled by select_c2t_core 335, which selects whether communication to the TDRs 120 is from the JTAG broadcast controller 310, or whether communication to the TDRs 120 is from the CPU2TDR core module 315. As indicated in the figure, TDR control from TAP controller 115 provides a signal BCAST_TDR_EN to enable broadcast functionality, and to provide data (BCAST_TDR_DATA) that is to be sent to the TDRs 120.

Figure 4:
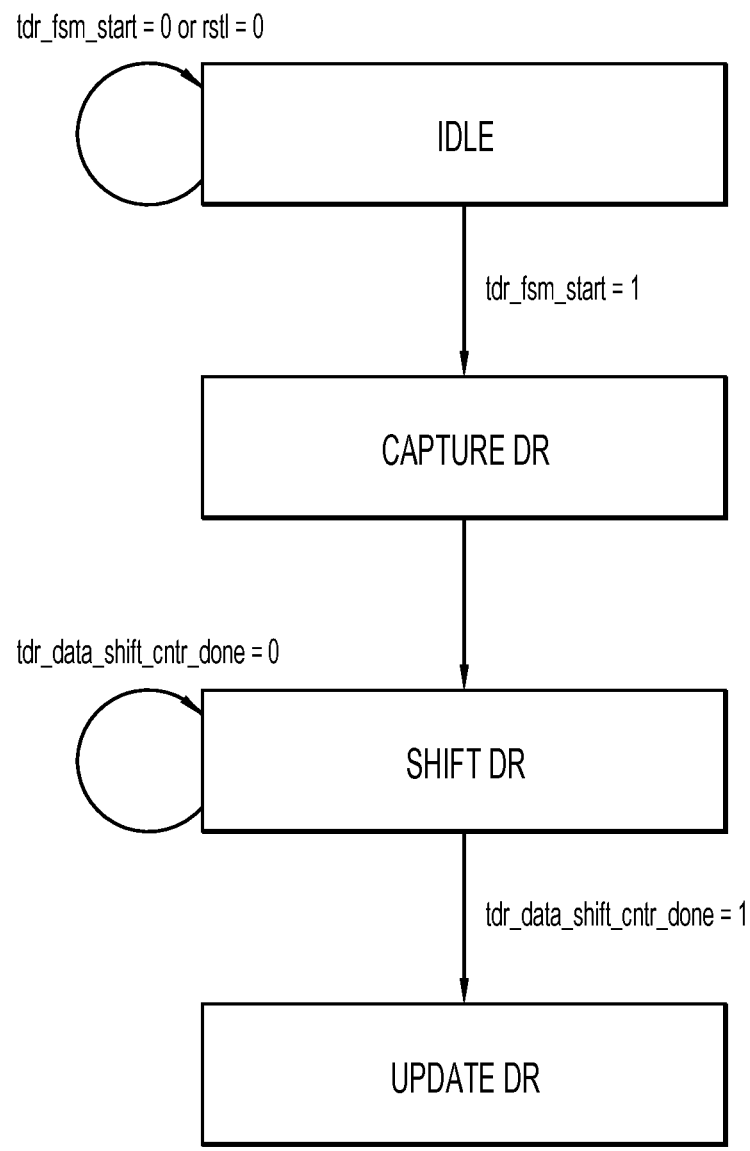
FIG. 4 shows a four state FSM that can be employed by the CPU2TDR interface logic, in accordance with an example embodiment.

FIG. 4 shows a four state FSM that can be employed by the CPU2TDR interface logic 150 or 250, in accordance with an example embodiment. The described four states replace the 16 state FSM that is normally used in connection with testing via a HAG controller. As shown, the four states are Idle, Capture DR, Shift DR and Update DR. These states enable reading and writing of data that is stored in one or more CPU registers 132 shown in FIGS. 1 and 2 to the TDRs 120. Specifically, when tdr_fsm_start=0, the state remains at Idle. When CPU2TDR interface logic 250 receives a Write/Read request, tdr_fsm_start=1, and the state transitions to Capture DR, which enables TDR/s to capture test response data into TDR/s and, in a single TCK clock cycle, the state transitions to Shift DR, which writes new data into TDR/s and reads test response data from TDR/s simultaneously. While CPU2TDR interface logic 250 is operating in shift, tdr_data_drift_cntr_done=0 and the state remains at state Shift DR. When the operation of write/read is complete, tdr_data_shift_cntr_done=1, and the state transitions to Update DR, which, in a single TCK clock cycle, writes new data, and then transitions in a single TCK clock cycle to the Idle state. Those skilled in the art will appreciate that a four state FSM is a much more efficient way to move data to and from TDRs by avoiding the instruction load states of a standard TAP controller.

Figure 5:
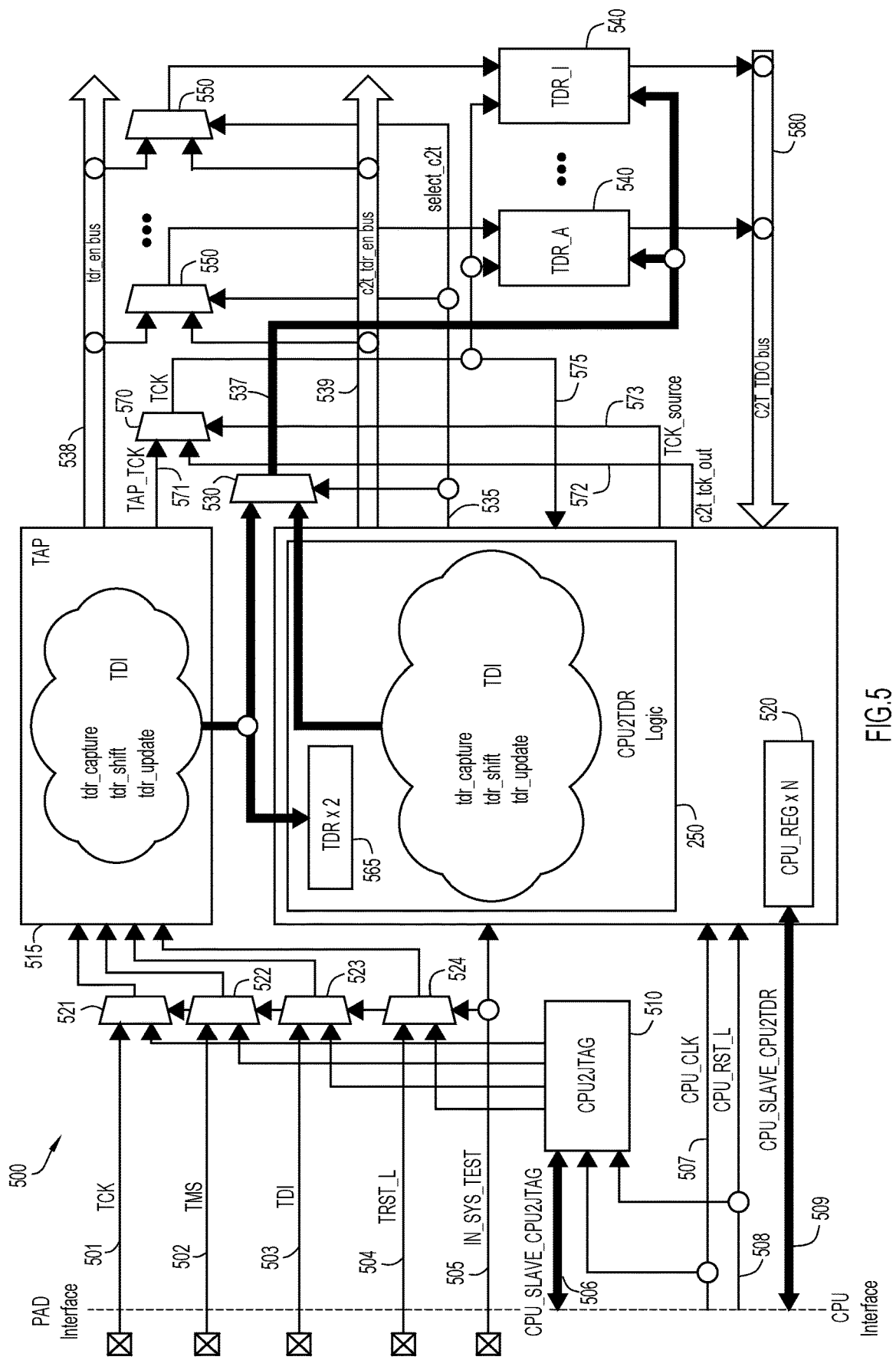
FIG. 5 shows how the CPU2TDR interface logic may be integrated into an overall chip system, in accordance with an example embodiment.

FIG. 5 shows how the CPU2TDR interface logic 250 may be integrated into an overall chip system 500, in accordance with an example embodiment. As shown, several pad interfaces are provided including for a timing clock TCK 501, a test mode select TMS 502, a test data in (TDI) 503, a test reset (active low) (TRST_L) 504, and an IN_SYS_TEST 505. Also provided, optionally, to support CPU2JTAG functionality is a CPU_SLAVE_CPU2JTAG bus 506 that is in communication with CPU2JTAG interface logic 510. Further provided is a CPU clock (CLK) 507, and CPU_RST_L 508, which are in communication with both CPU2JTAG interface logic 510 and CPU2TDR interface logic 250. Further still, a CPU_SLAVE_CPU2TDR bus 509 is in communication with CPU registers (CPU_REGs) 520.

As further shown, for the optional CPU2JTAG functionality, multiplexers 521, 522, 523, and 524 corresponding to each of the pad interfaces timing clock TCK 501, test mode select TMS 502, test data in (TDI) 503, and test reset (active low) (TRST_L) 504, are provided and are controlled by IN_SYS_TEST 505, which enables the pad interfaces timing clock TCK 501, test mode select TMS 502, test data in (TDI) 503, and test reset (active low) (TRST_L) 504 to communicate with TAP controller 515, or enables CPU2JTAG interface logic 510 to interject signaling on those pads.

As noted previously, CPU2TDR interface logic 250 makes it possible to bypass TAP controller 515 altogether, if so used in such a manner. To implement such functionality, both TAP controller 515 and CPU2TDR interface logic 250 can provide data (e.g., TDI) via multiplexer 530, which is controlled via line select_c2t 535. That is, multiplexer 530 allows TDI to be supplied to TDRs 540 via bus 537. Select_c2t 535 also controls multiplexers 530 which are connected to tdr_en bus 538 and c2t_tdr_en bus 539 which control which TDRs 540 are to be supplied with TDI data. That is, tdr_en bus 538 and c2t_tdr_en bus 539 are address busses that enable a given TDR 540 to accept data.

One more multiplexer 570 is used for timing. More specifically, multiplexer 570 receives as inputs a TAP_TCK and c2t_tck_out (i.e., the timing clocks supplied via the TAP controller 515 and CPU2TDR interface logic 250, respectively) and is controlled by TCK_source 573 (also supplied by CPU2TDR interface logic 250). The output of multiplexer 570 is a timing clock 575 that is supplied to the TDRs 540 and to the CPU2TDR interface logic 250.

Test data out (TDO) is provided from the TDRs 540 back to CPU2TDR interface logic 250 and CPU registers 520 via C2T_TDO bus 580 for storage. Also, interface 565 is provided to enable TAP controller 515 to take advantage of the broadcast functionality provided by CPU2TDR interface logic 250.

In operation, CPU registers 520 are loaded with TDI data via CPU_SLAVE_CPU2TDR bus 509. By virtue of setting, e.g., IN_SYS_TEST 505, select_c2t 535 is asserted by CPU2TDR interface logic 250 causing multiplexers 530 and 550 to be responsive to the c2t_tdr_en bus 539, thus giving TDR access control to CPU2TDR interface logic 250. Meanwhile, proper timing is provided via operation of multiplexer 570 controlled by TCK_source 573, such that TDI data is moved into one or more TDRs 540 according to the four state FSM described in connection with FIG. 4. Notably, c2t_tdr_en bus 539 can enable more than one TDR 540 at a time, thus resulting in multi-hot addressing of multiple TDRs 540, thus speeding up the loading of TDI by enabling parallel loading of TDI data via bus 537.

It is also possible for ATE (not shown) to leverage the TDR broadcast functionality of CPU2TDR interface logic 250. TDI received at TAP controller 515 can be routed through interface 565 by, effectively, shutting off a path via multiplexer 530, and forcing the TDI data to pass through CPU2TDR interface logic 250 (via interface 565). In such a case, test response data may be communicated from TDRs 540 to TAP controller 515. Thus, the embodiments described herein enable two types of TDR broadcast capabilities by using multi-hot addressing of the c2t_tdr_en bus 539 for data stored in CPU registers 520, or for data received via TAP controller 515.

Figure 6:
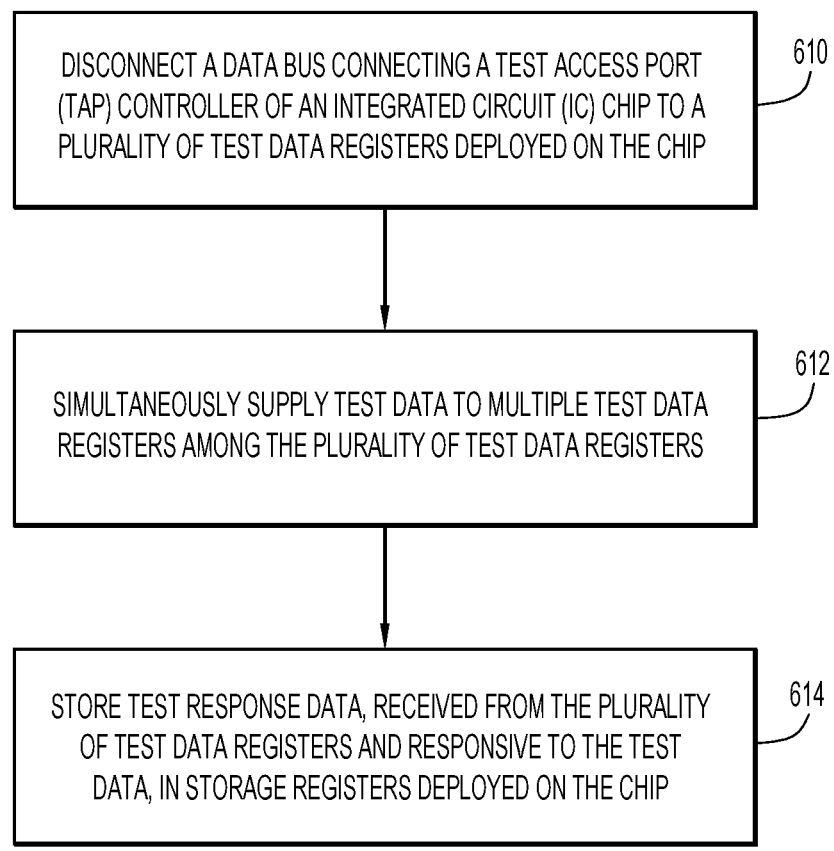
FIG. 6 is a flowchart depicting a series of operations performed by the CPU2TDR interface logic, in accordance with an example embodiment.

FIG. 6 is a flowchart depicting a series of operations performed by the CPU2TDR interface logic, in accordance with an example embodiment. At 610, an operation disconnects a data bus connecting a test access port (TAP) controller of an integrated circuit (IC) chip to a plurality of test data registers deployed on the chip. At 612, an operation simultaneously supplies test data to multiple test data registers among the plurality of test data registers. And, at 614, an operation stores test response data, received from the plurality of test data registers and responsive to the test data, in storage registers deployed on the chip.

The programs or methodologies described herein are identified based upon the application for which they are implemented in a specific embodiment. However, it should be appreciated that any particular program nomenclature herein is used merely for convenience, and thus the embodiments should not be limited to use solely in any specific application identified and/or implied by such nomenclature.

Data relating to operations described herein may be stored within any conventional or other data structures (e.g., files, arrays, lists, stacks, queues, records, etc.) and may be stored in any desired storage unit (e.g., database, data or other repositories, queue, etc.). The data transmitted between entities may include any desired format and arrangement, and may include any quantity of any types of fields of any size to store the data. The definition and data model for any datasets may indicate the overall structure in any desired fashion (e.g., computer-related languages, graphical representation, listing, etc.).

The present embodiments may employ any number of any type of user interface (e.g., Graphical User Interface (GUI), command-line, prompt, etc.) for obtaining or providing information (e.g., data relating to scraping network sites), where the interface may include any information arranged in any fashion. The interface may include any number of any types of input or actuation mechanisms (e.g., buttons, icons, fields, boxes, links, etc.) disposed at any locations to enter/display information and initiate desired actions via any suitable input devices (e.g., mouse, keyboard, etc.). The interface screens may include any suitable actuators (e.g., links, tabs, etc.) to navigate between the screens in any fashion.

The environment of the present embodiments may include any number of computer or other processing systems (e.g., client or end-user systems, server systems, etc.) and databases or other repositories arranged in any desired fashion, where the present embodiments may be applied to any desired type of computing environment (e.g., cloud computing, client-server, network computing, mainframe, stand-alone systems, etc.). The computer or other processing systems employed by the present embodiments may be implemented by any number of any personal or other type of computer or processing system (e.g., desktop, laptop, PDA, mobile devices, etc.), and may include any commercially available operating system and any combination of commercially available and custom software (e.g., machine learning software, etc.). These systems may include any types of monitors and input devices (e.g., keyboard, mouse, voice recognition, etc.) to enter and/or view information.

It is to be understood that any software of firmware of the present embodiments may be implemented in any desired computer language and could be developed by one of ordinary skill in the computer arts based on the functional descriptions contained in the specification and flow charts illustrated in the drawings. Further, any references herein of software performing various functions generally refer to computer systems or processors performing those functions under software control. The computer systems of the present embodiments may alternatively be implemented by any type of hardware and/or other processing circuitry.

Each of the elements described herein may couple to and/or interact with one another through interfaces and/or through any other suitable connection (wired or wireless) that provides a viable pathway for communications. Interconnections, interfaces, and variations thereof discussed herein may be utilized to provide connections among elements in a system and/or may be utilized to provide communications, interactions, operations, etc. among elements that may be directly or indirectly connected in the system. Any combination of interfaces can be provided for elements described herein in order to facilitate operations as discussed for various embodiments described herein.

The various functions of the computer or other processing systems may be distributed in any manner among any number of software and/or hardware modules or units, processing or computer systems and/or circuitry, where the computer or processing systems may be disposed locally or remotely of each other and communicate via any suitable communications medium (e.g., LAN, WAN, Intranet, Internet, hardwire, modem connection, wireless, etc.). For example, the functions of the present embodiments may be distributed in any manner among the various end-user/client and server systems, and/or any other intermediary processing devices. The software and/or algorithms described above and illustrated in the flow charts may be modified in any manner that accomplishes the functions described herein. In addition, the functions in the flow charts or description may be performed in any order that accomplishes a desired operation.

The software of the present embodiments may be available on a non-transitory computer useable medium (e.g., magnetic or optical mediums, magneto-optic mediums, floppy diskettes, CD-ROM, DVD, memory devices, etc.) of a stationary or portable program product apparatus or device for use with stand-alone systems or systems connected by a network or other communications medium.

The communication network may be implemented by any number of any type of communications network (e.g., LAN, WAN, Internet, Intranet, VPN, etc.). The computer or other processing systems of the present embodiments may include any conventional or other communications devices to communicate over the network via any conventional or other protocols. The computer or other processing systems may utilize any type of connection (e.g., wired, wireless, etc.) for access to the network. Local communication media may be implemented by any suitable communication media (e.g., local area network (LAN), hardwire, wireless link, Intranet, etc.).

The system may employ any number of any conventional or other databases, data stores or storage structures (e.g., files, databases, data structures, data or other repositories, etc.) to store information. The database system may be implemented by any number of any conventional or other databases, data stores or storage structures (e.g., files, databases, data structures, data or other repositories, etc.) to store information. The database system may be included within or coupled to the server and/or client systems. The database systems and/or storage structures may be remote from or local to the computer or other processing systems, and may store any desired data.

The embodiments presented may be in various forms, such as a system, a method, and/or a computer program product at any possible technical detail level of integration. The computer program product may include a non-transitory computer readable storage medium (or media) having computer readable program instructions thereon for causing a processor to carry out aspects of presented herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present embodiments may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Python, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), digital logic gates in one or more fixed or programmable integrated circuits, or programmable logic arrays (PLA) may execute the instructions by utilizing configuring the electronic circuitry, in order to perform aspects presented herein.

Aspects of the present embodiments are described herein with reference to flowchart illustrations and/or block diagrams of methods, apparatus (systems), and computer program products according to the embodiments. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In summary, in one form, a method is provided. The method includes disconnecting a data bus connecting a test access port (TAP) controller of an integrated circuit (IC) chip to a plurality of test data registers deployed on the chip; simultaneously supplying test data to multiple test data registers among the plurality of test data registers; and storing test response data, received from the plurality of test data registers and responsive to the test data, in storage registers deployed on the chip.

In an embodiment, the TAP controller operates in accordance with an Institute for Electrical and Electronics Engineers (IEEE) 1149.1 Standard Joint Test Action Group (JTAG) Test Access Port (TAP) controller or IEEE 1687-2014 Standard (IJTAG).

The method may further include storing the test data in storage registers that are accessible by a central processing unit (CPU) of a board on which the IC chip is mounted.

The method may also include the CPU accessing the storage registers via at least one of an Advanced High performance Bus, Advanced Xtensible Bus, or Peripheral Component Interconnect Express (PCIe) bus.

The method may still also include receiving the test data from the TAP controller.

The method may further include controlling at least one multiplexer to enable the disconnecting and the supplying, and enabling access to the plurality of test data registers via an address bus that is configured to access the multiple test data registers at a same time.

The method may also include supplying a timing clock signal for the plurality of test data registers that is based on a timing clock of the TAP controller.

In an embodiment, supplying the test data to multiple test data registers among the plurality of test data registers may include operating a four state finite state machine, encompassing states of Idle, Capture_DR, Shift_DR and Update_DR.

In another form, an apparatus device may also be provided in accordance with an embodiment. The device may include a test access port (TAP) controller deployed an integrated circuit (IC) chip; a plurality of test data registers deployed on the chip and selectably in communication with the TAP controller via a data bus; and a processor, when executing logic instructions, configured to: disconnect the data bus connecting the TAP controller to the plurality of test data registers deployed on the chip, simultaneously supply test data to multiple test data registers among the plurality of test data registers, and store test response data, received from the plurality of test data registers and responsive to the test data, in storage registers deployed on the chip.

In an embodiment, the TAP controller operates in accordance with an Institute for Electrical and Electronics Engineers (IEEE) 1149.1 Standard Joint Test Action Group (JTAG) Test Access Port (TAP) controller or IEEE 1687-2014 Standard (IJTAG).

In an embodiment, the processor is further configured to store the test data in storage registers that are accessible by a central processing unit (CPU) of a board on which the IC chip is mounted.

In another embodiment, the processor is configured to allow the CPU to access the storage registers via a Peripheral Component Interconnect Express (PCIe) bus.

In still another embodiment, the test data is received from the TAP controller.

The apparatus may include at least one multiplexer that is configured to enable the processor to disconnect the data bus and to supply the test data.

The processor may be configured to enable access to the plurality of test data registers via an address bus that is configured to access the multiple test data registers at a same time.

The processor may be configured to supply the test data to multiple test data registers among the plurality of test data registers by operating a four state finite state machine.

In still another form, a non-transitory computer readable storage media is provided that is encoded with instructions that, when executed by a processor, cause the processor to disconnect a data bus connecting a test access port (TAP) controller of an integrated circuit (IC) chip to a plurality of test data registers deployed on the chip; simultaneously supply test data to multiple test data registers among the plurality of test data registers; and store test response data, received from the plurality of test data registers and responsive to the test data, in storage registers deployed on the chip.

In an embodiment, the TAP controller operates in accordance with an Institute for Electrical and Electronics Engineers (IEEE) 1149.1 Standard Joint Test Action Group (JTAG) Test Access Port (TAP) controller.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    disconnecting a test access port (TAP) controller of an integrated circuit (IC) chip from a data bus that connects the TAP controller to a plurality of test data registers deployed on the chip;
    after the disconnecting, supplying, via the data bus, test data, which is stored in a first storage register, to multiple test data registers among the plurality of test data registers;
    generating, by the IC chip performing a test, test response data responsive to the test data, and storing the test response data in the multiple test data registers; and
    obtaining the test response data from the multiple test data registers, and storing the test response data in a second storage register deployed on the chip.

2. The method of claim 1, wherein the TAP controller operates in accordance with one of an Institute for Electrical and Electronics Engineers (IEEE) 1149.1 Standard Joint Test Action Group (JTAG) Test Access Port (TAP) controller or IEEE 1687-2014 TAP controller.

3. The method of claim 1, further comprising storing the test data in the first storage register, which is accessible by a central processing unit (CPU) of a board on which the IC chip is mounted.

4. The method of claim 3, further comprising the CPU accessing the first storage register via at least one of an Advanced High Performance Bus, Advanced Xtensible Bus, or Peripheral Component Interconnect Express (PCIe) bus.

5. The method of claim 1, further comprising, receiving additional test data from the TAP controller via a bypass pathway.

6. The method of claim 1, further comprising controlling at least one multiplexer to enable the disconnecting and the supplying.

7. The method of claim 6, further comprising enabling access to the plurality of test data registers via an address bus that is configured to access the multiple test data registers at a same time.

8. The method of claim 1, further comprising supplying a timing clock signal for the plurality of test data registers that is based on a timing clock of the TAP controller.

9. The method of claim 1, wherein supplying the test data to the multiple test data registers among the plurality of test data registers comprises operating a four state finite state machine.

10. The method of claim 9, wherein states of the four state finite state machine comprise Idle, Capture_DR, Shift_DR and Update_DR.

11. An apparatus comprising:
a test access port (TAP) controller deployed an integrated circuit (IC) chip;
a plurality of test data registers deployed on the chip and selectably in communication with the TAP controller via a data bus; and
a processor, when executing stored logic instructions, configured to:
disconnect the TAP controller from the data bus;
after the disconnect, supply, via the data bus, test data, which is stored in a first storage register, to multiple test data registers among the plurality of test data registers;
generate, by the IC chip performing a test, test response data responsive to the test data, and store the test response data in the multiple test data registers; and
obtain the test response data from the multiple test data registers, and store the test response data in a second storage register deployed on the chip.

12. The apparatus of claim 11, wherein the TAP controller operates in accordance with one of an Institute for Electrical and Electronics Engineers (IEEE) 1149.1 Standard Joint Test Action Group (JTAG) Test Access Port (TAP) controller or IEEE 1687-2014 TAP controller.

13. The apparatus of claim 11, wherein the processor is further configured to store the test data in storage registers that are accessible by a central processing unit (CPU) of a board on which the IC chip is mounted.

14. The apparatus of claim 13, wherein the board is configured to allow the CPU to access the storage registers via at least one of an Advanced High Performance Bus, Advanced Xtensible Bus, or Peripheral Component Interconnect Express (PCIe) bus.

15. The apparatus of claim 11, wherein additional test data is received from the TAP controller via a bypass pathway.

16. The apparatus of claim 11, further comprising at least one multiplexer that is configured to enable the processor to disconnect the data bus and to supply the test data.

17. The apparatus of claim 16, wherein the processor is configured to enable access to the plurality of test data registers via an address bus that is configured to access the multiple test data registers at a same time.

18. The apparatus of claim 11, wherein the processor is configured to supply the test data to multiple test data registers among the plurality of test data registers by operating a four state finite state machine.

19. A non-transitory computer readable storage media encoded with instructions that, when executed by a processor, cause the processor to:
disconnect a test access port (TAP) controller of an integrated circuit (IC) chip from a data bus that connects the TAP controller to a plurality of test data registers deployed on the chip;
after the disconnecting, supply, via the date bus, test data, which is stored in a first storage register, to multiple test data registers among the plurality of test data registers;
generate, by the IC chip performing a test, test response data responsive to the test data, and store the test response data in the multiple test data registers; and
obtain the test response data from the multiple test data registers, and store the test response data in a second storage register deployed on the chip.

20. The non-transitory computer readable storage media of claim 19, wherein the TAP controller operates in accordance with an Institute for Electrical and Electronics Engineers (IEEE) 1149.1 Standard Joint Test Action Group (JTAG) Test Access Port (TAP) controller.

* * * * *